(12) United States Patent
Zheng (10) Patent No.: US 11,522,031 B2
(45) Date of Patent: Dec. 6, 2022

(54) DISPLAY PANEL, DISPLAY DEVICE, AND MANUFACTURING METHOD OF DISPLAY PANEL

(71) Applicant: Wuhan China Star Optoelectronics Semiconductor Display Technology Co., Ltd., Hubei (CN)

(72) Inventor: Ying Zheng, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 22 days.

(21) Appl. No.: 16/980,898

(22) PCT Filed: Jun. 30, 2020

(86) PCT No.: PCT/CN2020/099277
§ 371 (c)(1),
(2) Date: Sep. 15, 2020

(87) PCT Pub. No.: WO2021/243781
PCT Pub. Date: Dec. 9, 2021

(65) Prior Publication Data
US 2021/0376024 A1    Dec. 2, 2021

(30) Foreign Application Priority Data
Jun. 1, 2020    (CN) .......................... 202010486403.7

(51) Int. Cl.
*H01L 27/32* (2006.01)
*H01L 51/00* (2006.01)
(Continued)

(52) U.S. Cl.
CPC ...... *H01L 27/3262* (2013.01); *H01L 27/3248* (2013.01); *H01L 27/3265* (2013.01);
(Continued)

(58) Field of Classification Search
CPC ............. H01L 27/3262; H01L 27/3248; H01L 27/3265; H01L 51/0096; H01L 51/56; H01L 2227/323
(Continued)

(56) References Cited

U.S. PATENT DOCUMENTS

2016/0111487 A1* 4/2016 Jeong .................. H01L 27/3279
257/40
2016/0300902 A1* 10/2016 You ..................... H01L 27/3258
(Continued)

FOREIGN PATENT DOCUMENTS

| CN | 108666348 | 10/2018 |
| CN | 109638020 | 4/2019 |

(Continued)

OTHER PUBLICATIONS

English Machine Translation CN 110047846 (Year: 2019).*

*Primary Examiner* — Dzung Tran
(74) *Attorney, Agent, or Firm* — PV IP PC; Wei Te Chung; Ude Lu (57) ABSTRACT

A display panel, a display device, and a manufacturing method of the display panel are disclosed. The display panel includes an array substrate and a light-emitting function layer disposed on the array substrate. The display panel includes a display area and a sensor light-receiving area adjacent to the display area. The array substrate includes a thin film transistor array disposed in the display area, the light-emitting function layer is disposed in the display area and the sensor light-receiving area, and the thin film transistor array is electrically connected to the light-emitting function layer.

15 Claims, 5 Drawing Sheets (51) Int. Cl.
 *H01L 51/56* (2006.01)
 *H01L 27/12* (2006.01)
(52) U.S. Cl.
 CPC .......... *H01L 51/0096* (2013.01); *H01L 51/56*
  (2013.01); *H01L 27/1214* (2013.01); *H01L*
  *2227/323* (2013.01)
(58) Field of Classification Search
 USPC .......................................................... 257/72
 See application file for complete search history.

(56) References Cited

U.S. PATENT DOCUMENTS

| | | | |
|---|---|---|---|
| 2017/0005154 A1* | 1/2017 | You | H01L 27/3258 |
| 2018/0089485 A1* | 3/2018 | Bok | G06F 1/1684 |
| 2018/0151120 A1* | 5/2018 | Kim | H01L 51/5237 |
| 2018/0173349 A1* | 6/2018 | Cho | G06F 3/042 |
| 2019/0355799 A1* | 11/2019 | Jeong | H01L 27/3276 |
| 2020/0185477 A1 | 6/2020 | Xia | |
| 2020/0357871 A1 | 11/2020 | Chung et al. | |

FOREIGN PATENT DOCUMENTS

| | | |
|---|---|---|
| CN | 109979980 | 7/2019 |
| CN | 110047846 | 7/2019 |
| CN | 110571252 | 12/2019 |
| WO | WO 2020/071611 | 4/2020 |

\* cited by examiner

DISPLAY PANEL, DISPLAY DEVICE, AND MANUFACTURING METHOD OF DISPLAY PANEL

RELATED APPLICATIONS

This application is a National Phase of PCT Patent Application No. PCT/CN2020/099277 having International filing date of Jun. 30, 2020, which claims the benefit of priority of Chinese Patent Application No. 202010486403.7 filed on Jun. 1, 2020. The contents of the above applications are all incorporated by reference as if fully set forth herein in their entirety.

FIELD AND BACKGROUND OF THE INVENTION

The present disclosure relates to the field of display panel technologies, and particularly relates to a display panel, a display device, and a manufacturing method of the display panel.

With continuous development of science and technology, the display technology field is constantly updated. Flexible devices made of flexible substrates are expected to become mainstream devices of a next generation of optoelectronic devices. Full screens, as brand-new displays, have brought people a brand-new visual experience and sensory impact due to a high screen-to-body ratio, and have become a goal pursued by display manufacturers.

With the development of technology, under-screen fingerprint identification technology or facial recognition technology solves a problem of hiding a home entity key. However, a current mainstream design of an under-screen camera is still U/O cut, that is, in an actual application process, it is usually necessary to define a mounting hole in a flexible organic light-emitting display device. Generally, the mounting hole is defined in a non-display area outside an active display area of a display panel. In this way, a hole needs to be defined in films of a whole camera area. On one hand, a drilling process of the hole involves a cumbersome manufacturing process, and residual carbon powder from cutting produced during drilling of the hole can easily cause poor display near the active display area, resulting in a low yield of finished products; on the other hand, a design of drilling a hole in the non-display area reduces an area of a display area and cannot achieve a real full screen.

The present disclosure provides a display panel, a display device, and a manufacturing method of the display panel, which can prevent drilling a hole in the display panel and realize full screen display while realizing under-screen identification technology.

SUMMARY OF THE INVENTION

In a first aspect, the present disclosure provides a display panel, including an array substrate and a light-emitting function layer disposed on the array substrate, wherein the display panel includes a display area and a sensor light-receiving area adjacent to the display area;

wherein the array substrate includes a thin film transistor array disposed in the display area, the light-emitting function layer is disposed in the display area and the sensor light-receiving area, and the thin film transistor array is electrically connected to the light-emitting function layer.

In the display panel provided by the present disclosure, the thin film transistor array includes first thin film transistors and second thin film transistors, and the second thin film transistors are disposed close to the sensor light-receiving area; wherein the light-emitting function layer includes first light-emitting units disposed in the display area and second light-emitting units disposed in the sensor light-receiving area;

wherein the first thin film transistors are electrically connected to the first light-emitting units, and the second thin film transistors are electrically connected to the second light-emitting units.

In the display panel provided by the present disclosure, the display panel further includes transparent electrodes disposed on the second thin film transistors and electrically connected to the second thin film transistors, the transparent electrodes extend from the display area to the sensor light-receiving area, and the transparent electrodes are electrically connected to the second light-emitting units.

In the display panel provided by the present disclosure, the display panel further includes a base substrate, the base substrate includes a first organic layer, an inorganic layer, and a second organic layer, the inorganic layer and the second organic layer are sequentially disposed on the first organic layer, and the array substrate and the light-emitting function layer are sequentially disposed on the second organic layer;

wherein the first organic layer is disposed in the display area, and a material of the first organic layer includes yellow polyimide; the second organic layer is disposed in the display area and the sensor light-receiving area, and a material of the second organic layer includes colorless polyimide; and the inorganic layer is disposed in the display area and the sensor light-receiving area.

In the display panel provided by the present disclosure, an inorganic insulating layer arranged in multi-layer stack is disposed in the sensor light-receiving area of the array substrate.

In the display panel provided by the present disclosure, the inorganic insulating layer arranged in multi-layer stack includes a buffer layer, and a first gate insulating layer, a second gate insulating layer, and an interlayer dielectric layer sequentially disposed on the buffer layer.

In the display panel provided by the present disclosure, materials of the buffer layer, the first gate insulating layer, the second gate insulating layer, and the interlayer dielectric layer include any one of silicon oxide or silicon nitride.

In a second aspect, the present disclosure further provides a manufacturing method of the display panel, wherein the display panel includes a display area and a sensor light-receiving area adjacent to the display area; and the manufacturing method includes following steps:

manufacturing an array substrate, wherein the array substrate includes a thin film transistor array disposed in the display area; and manufacturing a light-emitting function layer on the array substrate, wherein the light-emitting function layer is disposed in the display area and the sensor light-receiving area, and the thin film transistor array is electrically connected to the light-emitting function layer.

In the manufacturing method of the display panel provided by the present disclosure, the thin film transistor array includes first thin film transistors and second thin film transistors, and the second thin film transistors are disposed close to the sensor light-receiving area; wherein the light-emitting function layer includes first light-emitting units disposed in the display area and second light-emitting units disposed in the sensor light-receiving area;

wherein the first thin film transistors are electrically connected to the first light-emitting units, and the second thin film transistors are electrically connected to the second light-emitting units.

In the manufacturing method of the display panel provided by the present disclosure, the manufacturing method further includes following step:

disposing transparent electrodes between the second thin film transistors and the second light-emitting units to realize electric connections between the second thin film transistors and the second light-emitting units.

In the manufacturing method of the display panel provided by the present disclosure, the manufacturing method further includes following steps:

providing a glass substrate;

forming a first organic layer on the glass substrate, wherein a material of the first organic layer includes yellow polyimide;

forming an inorganic layer on the first organic layer, wherein a material of the inorganic layer includes any one of silicon oxide or silicon nitride;

forming a second organic layer on the inorganic layer, wherein a material of the second organic layer includes colorless polyimide, and the array substrate and the light-emitting function layer are sequentially disposed on the second organic layer; and removing the glass substrate and the first organic layer disposed in the sensor light-receiving area.

In the manufacturing method of the display panel provided by the present disclosure, the step of removing the glass substrate and the first organic layer disposed in the sensor light-receiving area includes following steps:

removing the glass substrate by laser lift-off technology; and removing the first organic layer disposed in the sensor light-receiving area by laser cauterization.

In a third aspect, the present disclosure further provides a display device, including a display panel, and an optical sensor disposed on a back of the display panel;

wherein the display panel includes an array substrate and a light-emitting function layer disposed on the array substrate, the display panel includes a display area and a sensor light-receiving area adjacent to the display area;

wherein the array substrate includes a thin film transistor array disposed in the display area, the light-emitting function layer is disposed in the display area and the sensor light-receiving area, and the thin film transistor array is electrically connected to the light-emitting function layer; and wherein the optical sensor is disposed correspondingly to the sensor light-receiving area.

In the display device provided by the present disclosure, the optical sensor includes any one of a camera, a fingerprint recognition sensor, or a facial recognition sensor.

In the display device provided by the present disclosure, the thin film transistor array includes first thin film transistors and second thin film transistors, and the second thin film transistors are disposed close to the sensor light-receiving area; wherein the light-emitting function layer includes first light-emitting units disposed in the display area and second light-emitting units disposed in the sensor light-receiving area;

wherein the first thin film transistors are electrically connected to the first light-emitting units, and the second thin film transistors are electrically connected to the second light-emitting units.

In the display device provided by the present disclosure, the display panel further includes transparent electrodes disposed on the second thin film transistors and electrically connected to the second thin film transistors, the transparent electrodes extend from the display area to the sensor light-receiving area, and the transparent electrodes are electrically connected to the second light-emitting units.

In the display device provided by the present disclosure, the display panel further includes a base substrate, the base substrate includes a first organic layer, an inorganic layer, and a second organic layer, the inorganic layer and the second organic layer are sequentially disposed on the first organic layer, and the array substrate and the light-emitting function layer are sequentially disposed on the second organic layer;

wherein the first organic layer is disposed in the display area, and a material of the first organic layer includes yellow polyimide; the second organic layer is disposed in the display area and the sensor light-receiving area, and a material of the second organic layer includes colorless polyimide; and the inorganic layer is disposed in the display area and the sensor light-receiving area.

In the display device provided by the present disclosure, an inorganic insulating layer arranged in multi-layer stack is disposed in the sensor light-receiving area of the array substrate.

In the display device provided by the present disclosure, the inorganic insulating layer arranged in multi-layer stack includes a buffer layer, and a first gate insulating layer, a second gate insulating layer, and an interlayer dielectric layer sequentially disposed on the buffer layer.

In the display device provided by the present disclosure, materials of the buffer layer, the first gate insulating layer, the second gate insulating layer, and the interlayer dielectric layer include any one of silicon oxide or silicon nitride.

Beneficial Effects

Compared with the prior art, in the display panel, the display device, and the manufacturing method of the display panel provided by the present disclosure, the display panel includes a display area and a sensor light-receiving area, and both of the display area and the sensor light-receiving area are provided with the light-emitting functional layer for light-emitting display, and the thin film transistor array for controlling light-emitting display of the light-emitting functional layer in the array substrate is disposed in the display area, which prevents disposing metal layers and semiconductor layers with shielding effect in the sensor light-receiving area and improves a light transmission effect of the sensor light-receiving area, thereby making the sensor light-receiving area achieve good light transmission function without drilling a hole, and preventing poor display of the display area caused by drilling a hole, which is conducive to realizing under-screen identification technology and improving a yield of the display panel. Additionally, both the display area and the sensor light-receiving area can be used for display, which can achieve full screen display. Therefore, the display panel provided by the present disclosure can realize both the under-screen identification technology and the full screen display without drilling a hole.

BRIEF DESCRIPTION OF THE SEVERAL VIEWS OF THE DRAWINGS

Following describes specific implementations of the present disclosure in detail with reference to accompanying drawings, which will make the technical solutions and other beneficial effects of the present disclosure obvious.

DESCRIPTION OF SPECIFIC EMBODIMENTS OF THE INVENTION

A clear and complete description of the technical solution will be given in combination with the accompanying drawings in the embodiments of the present disclosure. Obviously, the embodiments described are only a part of embodiments of the present disclosure and not all of them. Based on the embodiment of the present disclosure, all other embodiments obtained by those skilled in the art without making any invention efforts all belong to a protection scope of the present disclosure.

In the description of the present disclosure, it should be understood that, orientational or positional relationships indicated by terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", etc. are based on orientational or positional relationships shown in the drawings. These terms are only for convenience describing the present disclosure and simplifying the description, and do not indicate or imply that devices or elements referred to must have specific orientations, be constructed and operate in specific orientations, and therefore cannot be understood as a limitation on present disclosure. In addition, terms such as "first" and "second" are used herein for purposes of description, and should not be interpreted as indicate or imply relative importance or significance. Therefore, features limited by terms such as "first" and "second" can explicitly or impliedly includes one or more than one these features. In the description of the present disclosure, "a plurality of" means two or more than two, unless otherwise specified.

In description of the present disclosure, it should be noted, the terms "install", "connect", and "couple" shall be understood broadly, unless otherwise explicitly stated and defined, and may be, for example, a fixed connection, a detachable connection, or an integral connection; a mechanical connection or an electrical connection; directly connected or indirectly connected through an intermediate medium; an internal connection of the two elements. The specific meanings of the above terms in the present disclosure can be understood in the specific circumstances for those skilled in the art.

In the present disclosure, unless specifically stated and defined otherwise, that a first feature is "on" or "under" a second feature may include: the first feature and the second feature are not in direct contact but are contacted by another feature between them. Furthermore, that the first feature is "on", "above", or "upon" the second feature includes that the first feature is directly above and obliquely above the second feature, or merely indicates that the first feature is higher in level than the second feature. That the first feature is "under" or "below" the second feature includes that the first feature is directly below and obliquely below the second feature, or merely indicates that the first feature is lower in level than the second feature.

Following disclosure provides various different implementations or examples for implementing different structures of the present disclosure. To simplify the disclosure of the present disclosure, components and settings of specific examples are described below. Of course, they are merely examples and are not intended to limit the present disclosure. In addition, the present disclosure may repeat reference numbers and/or reference letters in different examples, and such repetition is for purpose of simplicity and clarity, and does not indicate relationship between the various embodiments and/or settings discussed. In addition, examples of various specific processes and materials are provided in the present disclosure, but those of ordinary skill in the art may be aware of application of other processes and/or other materials.

Figure 1:
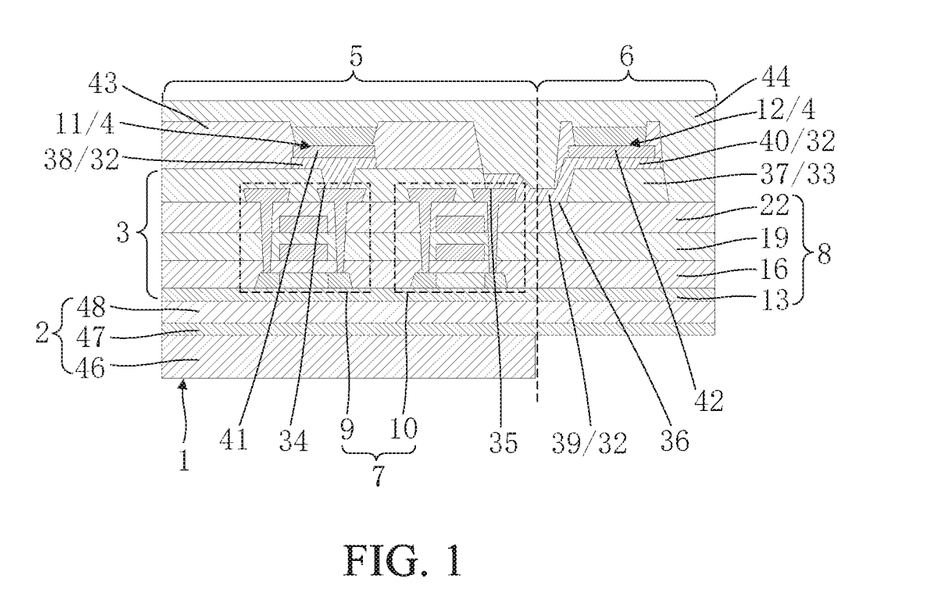
FIG. 1 is a partial structural schematic view of a display panel provided in an embodiment of the present disclosure.
Figure 2:
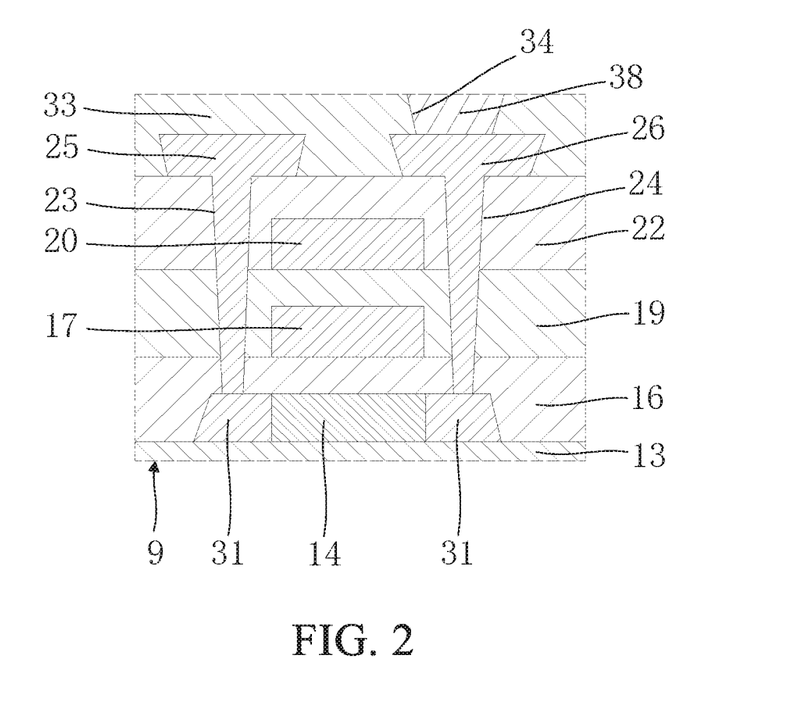
FIG. 2 is a structural schematic view of a first thin film transistor provided in FIG. 1.
Figure 3:
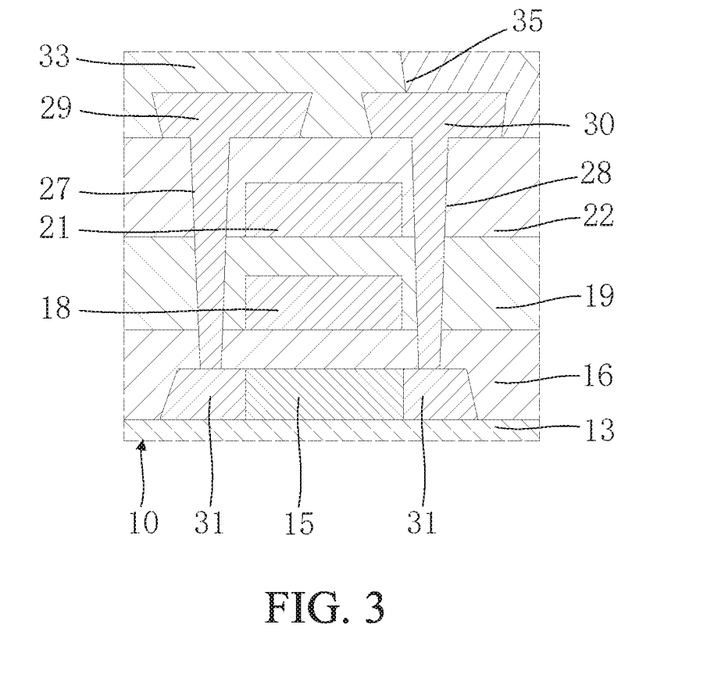
FIG. 3 is a structural schematic view of a second thin film transistor provided in FIG. 1.

As shown in FIG. 1 to FIG. 3, an embodiment of the present disclosure provides a display panel 1, the display panel 1 includes a base substrate 2, and an array substrate 3 and a light-emitting function layer 4 sequentially disposed on the base substrate 2. The display panel 1 includes a display area 5 and a sensor light-receiving area 6 adjacent to the display area 5. Wherein, the array substrate 3 includes a thin film transistor array 7 disposed in the display area 5 and an inorganic insulating layer 8 arranged in multi-layer stack and disposed in the sensor light-receiving area 6. The light-emitting function layer 4 is disposed in the display area 5 and the sensor light-receiving area 6, and the thin film transistor array 7 is electrically connected to the light-emitting function layer 4.

Specifically, an optical sensor may be disposed on a back (that is, a side of the base substrate 2 away from the array substrate 3) of the display panel 1 and disposed correspondingly to the sensor light-receiving area 6. Then the optical sensor can collect optical signals through the sensor light-receiving area 6 of the display panel 1, thereby realizing under-screen identification technology. The optical sensor includes a camera, a fingerprint recognition sensor, a facial recognition sensor, or other sensors.

Specifically, the thin film transistor array 7 includes first thin film transistors 9 and second thin film transistors 10, and the second thin film transistors 10 are disposed close to the sensor light-receiving area 6. The light-emitting function layer 4 includes first light-emitting units 11 disposed in the display area 5 and second light-emitting units 12 disposed in the sensor light-receiving area 6. The first thin film transistors 9 are electrically connected to the first light-emitting units 11 to control the first light-emitting units 11 to emit light and display in the display area 5, and the second thin film transistors 10 are electrically connected to the second light-emitting units 12 to control the second light-emitting units 12 to emit light and display in the sensor light-receiving area 6, which is conducive to realizing a full screen display. A number of the first thin film transistors 9 and a number of the first light-emitting units 11 are the same, and the number is multiple. A plurality of the first thin film transistors 9 are electrically connected to a plurality of the first light-emitting units 11 one by one. A number of the second thin film transistors 10 and a number of the second light-emitting units 12 are the same, and the number is multiple. A plurality of the second thin film transistors 10 are electrically connected to a plurality of the second light-emitting units 12 one by one. It should be noted that in the embodiment, a first thin film transistor 9, a second thin film transistor 10, a corresponding first light-emitting unit 11, and a corresponding second light-emitting unit 12 are taken as examples for specific description.

Specifically, the display area 5 of the array substrate 3 includes a buffer layer 13, a first semiconductor unit 14, a second semiconductor unit 15, a first gate insulating layer 16, a first gate electrode 17, a second gate electrode 18, a second gate insulating layer 19, a third gate electrode 20, a fourth gate electrode 21, an interlayer dielectric layer 22, a first source electrode 25, a first drain electrode 26, a second source electrode 29, and a second drain electrode 30. The buffer layer 13 covers the base substrate 2. The first semiconductor unit 14 and the second semiconductor unit 15 are disposed on the buffer layer 13 and are arranged at intervals. The first gate insulating layer 16 covers the buffer layer 13, the first semiconductor unit 14, and the second semiconductor unit 15. The first gate electrode 17 and the second gate electrode 18 are disposed on the first gate insulating layer 16 and are corresponding to the first semiconductor unit 14 and the second semiconductor unit 15, respectively. The second gate insulating layer 19 covers the first gate insulating layer 16, the first gate electrode 17, and the second gate electrode 18. The third gate electrode 20 and the fourth gate electrode 21 are disposed on the second gate insulating layer 19 and are corresponding to the first gate electrode 17 and the second gate electrode 18, respectively. The interlayer dielectric layer 22 covers the second gate insulating layer 19, the third gate electrode 20, and the fourth gate electrode 21. The first source electrode 25 and the first drain electrode 26 are disposed on the interlayer dielectric layer 22 and are electrically connected to both sides of the first semiconductor unit 14 through first through hole 23 and second through hole 24, respectively. The second source electrode 29 and the second drain electrode 30 are disposed on the interlayer dielectric layer 22 and are electrically connected to both sides of the second semiconductor unit 15 through third through hole 27 and fourth through hole 28, respectively.

Specifically, ohmic contact units 31 may also be disposed on both sides of the first semiconductor unit 14 and both sides of the second semiconductor unit 15. The ohmic contact units 31 may be formed by heavy doping on both sides of the first semiconductor unit 14 and both sides of the second semiconductor unit 15. The first source electrode 25 and the first drain electrode 26 are respectively connected to the ohmic contact units 31 on both sides of the first semiconductor unit 14, and the second source electrode 29 and the second drain electrode 30 are respectively connected to the ohmic contact units 31 on both sides of the second semiconductor unit 15.

Wherein, the first semiconductor unit 14, the first gate electrode 17, the third gate electrode 20, the first source electrode 25, and the first drain electrode 26 constitute the first thin film transistor 9; the second semiconductor unit 15, the second gate electrode 18, the fourth gate electrode 21, the second source electrode 29, and the second drain electrode 30 constitute the second thin film transistor 10. Additionally, the buffer layer 13, the first gate insulating layer 16, the second gate insulating layer 19, and the interlayer dielectric layer 22 disposed in the display area 5 of the array substrate 3 extend to the sensor light-receiving area 6 to form the inorganic insulating layer 8 arranged in multi-layer stack. It should be noted that semiconductor layers and metal layers disposed in a same layer with semiconductor units, gate electrodes, source electrodes, and drain electrodes in the first thin film transistor 9 and the second thin film transistor 10 are all disposed in the display area 5, and the sensor light-receiving area 6 of the array substrate 3 is not provided with the semiconductor layers and the metal layers with shielding effect, which is conducive to improving a light transmittance of the sensor light-receiving area 6.

Specifically, materials of the buffer layer 13, the first gate insulating layer 16, the second gate insulating layer 19, and the interlayer dielectric layer 22 include any one of silicon oxide or silicon nitride, which is conducive to improving the light transmittance. Structures and materials of the first thin film transistors 9 and the second thin film transistors 10 are the same. Of course, structures and materials of the first thin film transistor 9 and the second thin film transistor 10 may not be identical, there is no restriction herein.

Of course, structures of the first thin film transistor 9 and the second thin film transistor 10 may also be bottom gate type thin film transistors, and the gate electrodes may also be single layer gate electrodes, there is no restriction herein.

Specifically, the display panel 1 further includes a transparent electrode 32 disposed on the second thin film transistor 10 and electrically connected to the second thin film transistor 10, the transparent electrode 32 extends from the display area 5 to the sensor light-receiving area 6, and the transparent electrode 32 is electrically connected to the second light-emitting unit 12. A material of the transparent electrode 32 includes indium tin oxide (ITO).

Specifically, the array substrate 3 further includes a planarization layer 33 covering the interlayer dielectric layer 22, the first source electrode 25, the first drain electrode 26, the second source electrode 29, and the second drain electrode 30. In the display area 5, the planarization layer 33 includes a first anode connection hole 34 and a second anode connection hole 35 corresponding to the first drain electrode 26 and the second drain electrode 30, respectively. In the sensor light-receiving area 6, the planarization layer 33 includes an anode connection groove 36 and a planarization layer unit 37 adjacent to the anode connection groove 36, and the anode connection groove 36 extends to the display area 5 and communicates with the second anode connection hole 35. The transparent electrode 32 includes a first transparent electrode unit 38 disposed in the first anode connection hole 34, a second transparent electrode unit 39 disposed in the second anode connection hole 35 and the anode connection groove 36, and a third transparent electrode unit 40 disposed on the planarization layer unit 37. The first transparent electrode unit 38 extends to the surface of the planarization layer 33, and the second transparent electrode unit 39 is connected to the third transparent electrode unit 40. In an embodiment, a surface of the first transparent electrode unit 38 and a surface of the third transparent electrode unit 40 are in a same plane.

It should be noted that in order to improve the light transmittance of the sensor light-receiving area 6, other areas of the planarization layer 33 disposed in the sensor light-receiving area 6 can be hollowed out or hollowed out on the basis of forming the anode connection groove 36 and the planarization layer unit 37.

Specifically, the first light-emitting unit 11 includes a first anode 41, a first hole-injection layer, a first hole transport layer, a first light-emitting layer, a first electron transport layer, a first electron injection layer, and a first cathode sequentially disposed on the first transparent electrode unit 38. The second light-emitting unit 12 includes a second anode 42, a second hole-injection layer, a second hole transport layer, a second light-emitting layer, a second electron transport layer, a second electron injection layer, and a second cathode sequentially disposed on the third transparent electrode unit 40. The first drain electrode 26 of the first thin film transistor 9 is electrically connected to the first anode 41 of the first light-emitting unit 11 through the first transparent electrode unit 38, and the second drain electrode 30 of the second thin film transistor 10 is electrically connected to the second anode 42 of the second light-emitting unit 12 through the second transparent electrode unit 39 and the third transparent electrode unit 40. It should be noted that structures and materials of the first light-emitting unit 11 and the second light-emitting unit 12 may be the same. Of course, light-emitting materials of the first light-emitting layer and the second light-emitting layer may be different, and there is no restriction herein.

It should be noted that materials of the first anode 41 and the second anode 42 include metallic silver or indium tin oxide. When the materials of the first anode 41 and the second anode 42 are indium tin oxide, the first transparent electrode unit 38 can be used as the first anode 41, and the third transparent electrode unit 40 is as the second anode 42, thereby saving one process, which can be conducive to saving cost and improving production efficiency.

Specifically, the light-emitting function layer 4 further includes a pixel definition layer 43 disposed on the planarization layer 33. A first pixel opening is defined in the pixel definition layer 43 and corresponds to the first anode 41, a second pixel opening is defined in the pixel definition layer 43 and corresponds to the second anode 42, and the pixel definition layer 43 partially covers the first anode 41 and the second anode 42. The first hole-injection layer, the first hole transport layer, the first light-emitting layer, the first electron transport layer, the first electron injection layer, and the first cathode of the first light-emitting unit 11 are disposed in the first pixel opening. The second hole-injection layer, the second hole transport layer, the second light-emitting layer, the second electron transport layer, the second electron injection layer, and the second cathode of the second light-emitting unit 12 are disposed in the second pixel opening. The first light-emitting unit 11 may emit red light, green light, or blue light, and the second light-emitting unit 12 may also emit red light, green light, or blue light.

It should be noted that in order to improve the light transmittance of the sensor light-receiving area 6, the pixel definition layer 43 disposed in the sensor light-receiving area 6 can be hollowed out, and only the pixel definition layer around the second pixel openings can be reserved.

Specifically, the base substrate 2 includes a first organic layer 46, an inorganic layer 47, and a second organic layer 48, the inorganic layer 47 and the second organic layer 48 are sequentially disposed on the first organic layer 46, and the array substrate 3 and the light-emitting function layer 4 are sequentially disposed on the second organic layer 48. Wherein, the first organic layer 46 is disposed in the display area 5, and a material of the first organic layer 46 includes yellow polyimide (YPI). A thickness of the first organic layer 46 ranges from 6 to 10 microns. As YPI material has advantages of high temperature resistance (usually up to 500□), low coefficient of thermal expansion (CTE=3 ppm/□), excellent mechanical strength, and bending resistance, a reliability of the display panel 1 can be improved. The second organic layer 48 is disposed in the display area 5 and the sensor light-receiving area 6, and a material of the second organic layer 48 includes colorless polyimide (CPI). A thickness of the second organic layer 48 ranges from 6 to 10 microns. Due to good optical transmittance ($\lambda_{off}$=365 nm) of CPI material, it is conducive to improving transmittance of the sensor light-receiving area 6. The inorganic layer 47 is disposed in the display area 5 and the sensor light-receiving area 6, and a material of the inorganic layer 47 includes silicon oxide or silicon nitride, which can block water and oxygen.

It should be noted that if a flexible base substrate is manufactured by the CPI material only, light transmission performance of the sensor light-receiving area can be effectively guaranteed. However, due to high coefficient of thermal expansion (CTE=20 ppm/° C.) and weak mechanical properties of the CPI material, a CPI base substrate is easy to fall off due to stress mismatch when the CPI base substrate with greater thickness is in a post high temperature process, while performance of a CPI base substrate with lesser thickness is poor, which affects reliability of a device. While the YPI material has the advantages of high temperature resistance, low coefficient of thermal expansion, excellent mechanical strength, and bending resistance, however, after a YPI film is formed, color of the YPI film is generally light yellow to dark brown (depending on different monomers), which results in a transmittance of short wavelength in visible region close to 0 ($\lambda_{off}$=410 nm), when a hole is not defined, short wavelength light will be lost in the sensor light-receiving area, resulting in imaging distortion. Therefore, in the embodiment, the base substrate is manufactured by combining the first organic layer with the YPI material and the second organic layer with the CPI material, so that only the second organic layer with smaller thickness is reserved in the sensor light-receiving area, which not only ensures the reliability of the display panel, but also ensures the light transmittance of the sensor light-receiving area. At the same time, due to a low price of the YPI material, a production cost is greatly saved.

Specifically, the display panel 1 further includes a package layer 44 covering the array substrate 3 and the light-emitting function layer 4. The package layer 44 may be a thin film package layer, that is to say, the package layer 44 includes a first inorganic package layer covering the array substrate 3 and the light emitting functional layer 4, an organic package layer disposed on the first inorganic package layer, and a second inorganic package layer disposed on the first inorganic package layer and the organic package layer.

In the embodiment, the display panel 1 includes a display area 5 and a sensor light-receiving area 6, both of the display area 5 and the sensor light-receiving area 6 are provided with the light-emitting functional layer 4 for light-emitting display, and the thin film transistor array 7 for controlling the light-emitting display of the light-emitting functional layer 4 in the array substrate 3 is disposed in the display area 5, which prevents disposing metal layers and semiconductor layers with shielding effect in the sensor light-receiving area 6 and improves a light transmission effect of the sensor light-receiving area 6, thereby making the sensor light-receiving area 6 achieve good light transmission function without drilling a hole and preventing poor display of the display area caused by drilling a hole, which is conducive to realizing under-screen identification technology and improving a yield of the display panel 1. Additionally, the light-emitting functional layer 4 is disposed in the display area 5 and the sensor light-receiving area 6 to achieve full screen display. Therefore, the display panel 1 provided by the present disclosure can realize both the under-screen identification technology and the full screen display without drilling a hole.

Figure 4:
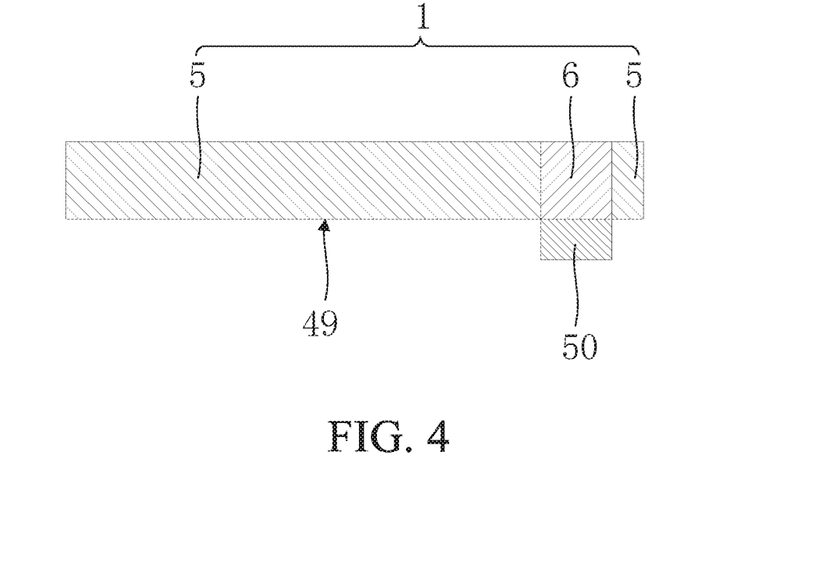
FIG. 4 is a structural schematic view of a display device provided in an embodiment of the present disclosure.

As shown in FIG. 4, an embodiment of the present disclosure further provides a display device 49, the display device 49 includes the display panel 1 in the above embodiment and an optical sensor 50 disposed on a back of the display panel 1. The optical sensor 50 is disposed correspondingly to the sensor light-receiving area 6.

Specifically, the optical sensor 50 includes a camera, a fingerprint recognition sensor, a facial recognition sensor, or other sensors.

In the embodiment, the display panel 1 includes a display area 5 and a sensor light-receiving area 6, both of the display area 5 and the sensor light-receiving area 6 are provided with the light-emitting functional layer 4 for light-emitting display, and the thin film transistor array 7 for controlling the light-emitting display of the light-emitting functional layer 4 in the array substrate 3 is disposed in the display area 5, which prevents disposing metal layers and semiconductor layers with shielding effect in the sensor light-receiving area 6 and improves a light transmission effect of the sensor light-receiving area 6, thereby making the sensor light-receiving area 6 provide effective optical signals for the optical sensor 50 without drilling a hole and preventing poor display of the display area caused by drilling a hole, realizing under-screen identification technology and improving a yield of the display device 49. Additionally, the light-emitting functional layer 4 is disposed in the display area 5 and the sensor light-receiving area 6, which can achieve full screen display of the display device 49. Therefore, the display device 49 provided by the present disclosure can realize both the under-screen identification technology and the full screen display without drilling a hole.

Figure 5:
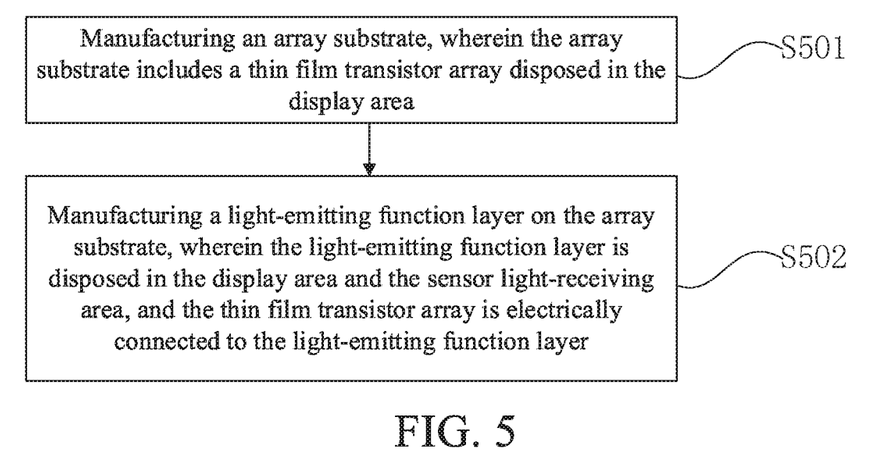
FIG. 5 is a flow diagram of a manufacturing method of a display panel provided in an embodiment of the present disclosure.

An embodiment of the present disclosure further provides a manufacturing method of a display panel, wherein the display panel includes a display area and a sensor light-receiving area adjacent to the display area. As shown in FIG. 5, the manufacturing method of the display panel includes following steps:

Step S501: manufacturing an array substrate, wherein the array substrate includes a thin film transistor array disposed in the display area.

Specifically, as shown in FIG. 1, the thin film transistor array 7 includes first thin film transistors 9 and second thin film transistors 10, and the second thin film transistors 10 are disposed close to the sensor light-receiving area 6.

Figure 6:
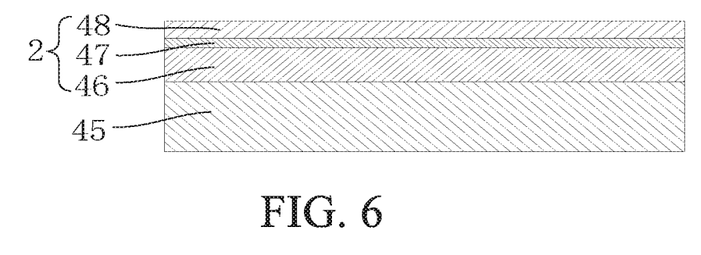
FIG. 6 is a structural schematic view of a base substrate manufactured in the manufacturing method of the display panel provided in an embodiment of the present disclosure.

Specifically, as shown in FIG. 6, before the Step S501, the manufacturing method further includes following steps:

providing a glass substrate 45;

forming a first organic layer 46 on the glass substrate 45 by coating method, wherein a material of the first organic layer 46 includes yellow polyimide, and a thickness of the first organic layer 46 ranges from 6 to 10 microns;

forming an inorganic layer 47 on the first organic layer 46 by chemical vapor deposition (CVD) process, wherein a material of the inorganic layer 47 includes any one of silicon oxide or silicon nitride; and forming a second organic layer 48 on the inorganic layer 47, wherein a material of the second organic layer 48 includes colorless polyimide, and a thickness of the second organic layer 48 ranges from 6 to 10 microns.

Figure 7:
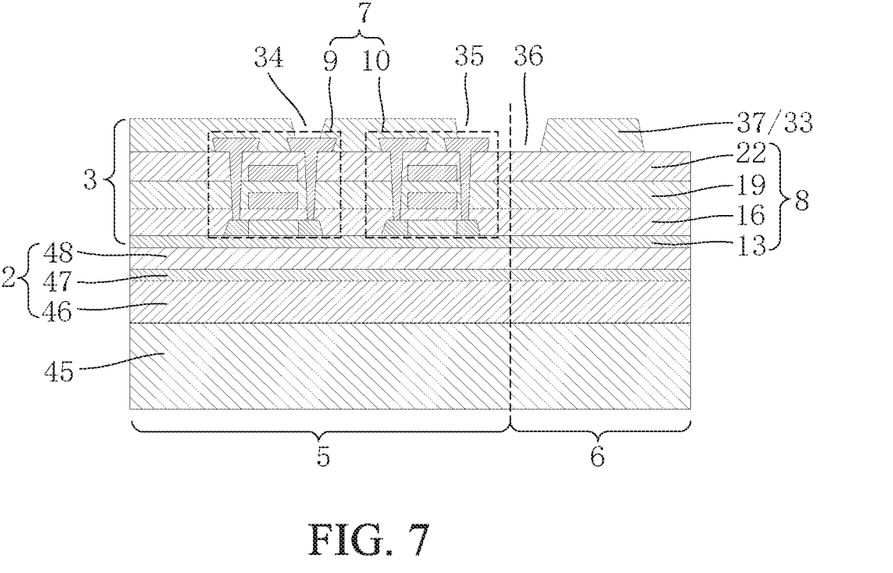
FIG. 7 is a structural schematic view of an array substrate manufactured on the basis of FIG. 6.

Specifically, as shown in FIG. 2, FIG. 3, and FIG. 7, the Step S501 includes following steps:

forming a buffer layer 13 on the second organic layer 48 by the CVD process;

forming an amorphous silicon (a-Si) layer, and forming a polysilicon (p-Si) layer after dehydrogenation, hydrogen fluoride (HF) treatment and excimer laser annealing (ELA) processes of the amorphous silicon layer;

forming first semiconductor units 14 and second semiconductor units 15 arranged at intervals in the display area 5 by patterning the polysilicon layer with photolithography and etching process (PEP), and removing all the polysilicon layer in the sensor light-receiving area 6; and forming ohmic contact units 31 by doping on both sides of the first semiconductor units 14 and both sides of the second semiconductor units 15;

forming a first gate insulating layer 16 covering the buffer layer 13, the first semiconductor units 14, and the second semiconductor units 15 by the CVD process;

forming a first metal layer on the first gate insulating layer 16 by physical vapor deposition (PVD) process, forming first gate electrodes 17 and second gate electrodes 18 corresponding to the first semiconductor units 14 and the second semiconductor units 15 respectively in the display area 5 by patterning the first metal layer with the PEP process, and removing all the first metal layer in the sensor light-receiving area 6;

forming a second gate insulating layer 19 covering the first gate insulating layer 16, the first gate electrodes 17, and the second gate electrodes 18;

forming a second metal layer on the second gate insulating layer 19 by the PVD process, forming third gate electrodes 20 and fourth gate electrodes 21 corresponding to the first gate electrodes 17 and the second gate electrodes 18 respectively in the display area 5 by patterning the second metal layer with the PEP process, and removing all the second metal layer in the sensor light-receiving area 6;

forming an interlayer dielectric layer 22 on the second gate insulating layer 19, the third gate electrodes 20, and the fourth gate electrodes 21;

forming first through holes 23, second through holes 24, third through holes 27, and fourth through holes 28 penetrating the interlayer dielectric layer 22, the second gate insulating layer 19, and the first gate insulating layer 16; wherein, the first through holes 23 and the second through holes 24 expose the ohmic contact units 31 on both sides of the first semiconductor unit 14, and the third through holes 27 and the fourth through holes 28 expose the ohmic contact units 31 on both sides of the second semiconductor unit 15;

depositing a third metal layer on the interlayer dielectric layer 22, and filling the third metal layer in the first through holes 23, the second through holes 24, the third through holes 27, and the fourth through holes 28 to correspondingly contact to the ohmic contact units 31; forming first source electrodes 25, first drain electrodes 26, second source electrodes 29, and second drain electrodes 30 respectively located in the first through holes 23, the second through holes 24, the third through holes 27, and the fourth through holes 28 and partially extending to the interlayer dielectric layer 22 by patterning the third metal layer; at the same time, removing all the third metal layer in the sensor light-receiving area 6, wherein a material of the third metal layer includes Ti/Al/Ti alloy; and covering a planarization layer 33 on the interlayer dielectric layer 22, the first source electrodes 25, the first drain electrodes 26, the second source electrodes 29, and the second drain electrodes 30; forming first anode connection holes 34 and second anode connection holes 35 in the display area 5 by patterning the planarization layer 33 to expose the first drain electrodes 26 and the second drain electrodes 30 respectively, and forming anode connection grooves 36 connected to the second anode connection holes 35 and planarization layer units 37 adjacent to the anode connection groove 36 in the sensor light-receiving area 6.

Specifically, the first semiconductor units 14, the first gate electrodes 17, the third gate electrodes 20, the first source electrodes 25, and the first drain electrodes 26 constitute the first thin film transistors 9;

the second semiconductor units 15, the second gate electrodes 18, the fourth gate electrodes 21, the second source electrodes 29, and the second drain electrodes 30 constitute the second thin film transistors 10. Additionally, the buffer layer 13, the first gate insulating layer 16, the second gate insulating layer 19, and the interlayer dielectric layer 22 disposed in the display area 5 of the array substrate 3 extend to the sensor light-receiving area 6 to form the inorganic insulating layer 8 arranged in multi-layer stack. Materials of the buffer layer 13, the first gate insulating layer 16, the second gate insulating layer 19, and the interlayer dielectric layer 22 include any one of silicon oxide or silicon nitride, which is conducive to improving the light transmittance.

It should be noted that low temperature polysilicon (LTPS) is used in a whole fabrication process of the array substrate, that is, the maximum process temperature is about 400□. It can prevent the base substrate from falling off and is conducive to ensuring a structure stability of the display panel.

Step S502: manufacturing a light-emitting function layer on the array substrate, wherein the light-emitting function layer is disposed in the display area and the sensor light-receiving area, and the thin film transistor array is electrically connected to the light-emitting function layer.

Specifically, as shown in FIG. 1, the light-emitting function layer 4 includes first light-emitting units 11 disposed in the display area 5 and second light-emitting units 12 disposed in the sensor light-receiving area 6, the first thin film transistors 9 are electrically connected to the first light-emitting units 11, and the second thin film transistors 10 are electrically connected to the second light-emitting units 12.

Figure 8:
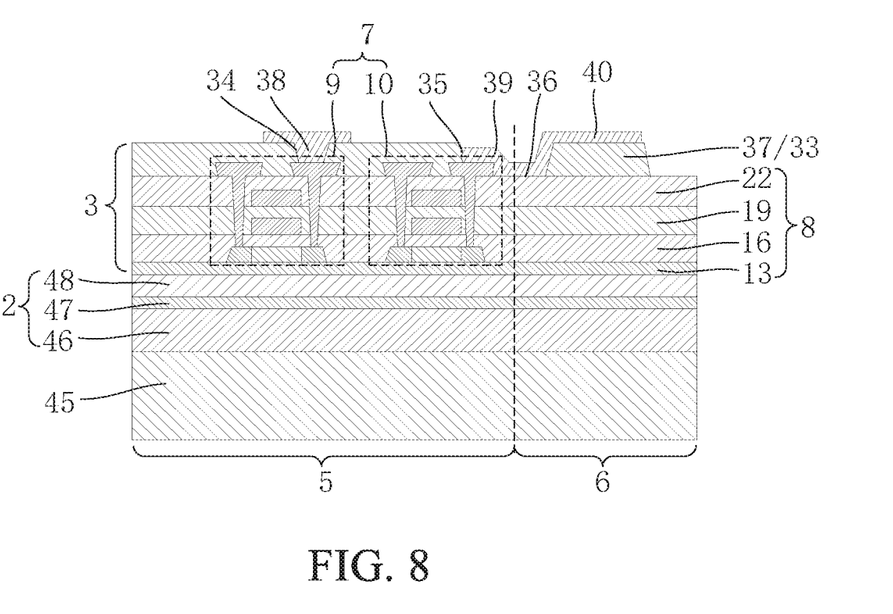
FIG. 8 is a structural schematic view of transparent electrodes manufactured on the basis of FIG. 7.

In an embodiment, as shown in FIG. 8, the manufacturing method of the display panel further includes a following step:

disposing transparent electrodes 32 between the second thin film transistors 10 and the second light-emitting units 12 to realize electrical connections between the second thin film transistors 10 and the second light-emitting units 12, wherein materials of the transparent electrode 32 include indium tin oxide.

Specifically, a transparent conductive film layer is formed on the planarization layer 33 and patterned to form first transparent electrode units 38 in the first anode connection holes 34, second transparent electrode units 39 in the second anode connection holes 35 and the anode connection grooves 36, and third transparent electrode units 40 disposed on the planarization layer units 37. The first transparent electrode units 38 extend to the surface of the planarization layer 33, and the second transparent electrode units 39 are connected to the third transparent electrode units 40. The first transparent electrode units 38, the second transparent electrode units 39 and the third transparent electrode units 40 constitute transparent electrodes 32. The first thin film transistors 9 are electrically connected to the first light-emitting units 11 through the first transparent electrode units 38, and the second thin film transistors 10 are electrically connected to the second light-emitting units 12 through the third transparent electrode units 40.

Figure 9:
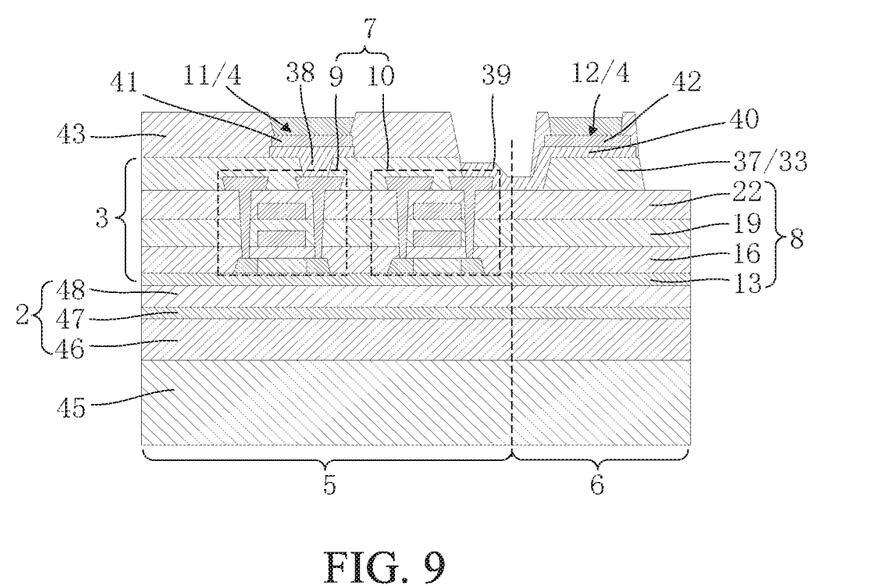
FIG. 9 is a structural schematic view of a light-emitting function layer manufactured on the basis of FIG. 8.

Specifically, as shown in FIG. 9, the step S502 includes following steps:

forming first anodes 41 and second anodes 42 on the first transparent electrode units 38 and the third transparent electrode units 40, respectively;

covering a pixel definition layer 43 on the planarization layer 33, the first anodes 41, and the second anodes 42, and forming first pixel openings and second pixel openings corresponding to the first anodes 41 and the second anodes 42 respectively by patterning the pixel definition layer 43, wherein the pixel definition layer 43 partially covers on the first anodes 41 and the second anodes 42; and forming first light-emitting units 11 by manufacturing a first hole-injection layer, a first hole transport layer, a first light-emitting layer, a first electron transport layer, a first electron injection layer, and a first cathode on the first anodes 41 in the first pixel openings sequentially, and forming second light-emitting units 12 by manufacturing a second hole-injection layer, a second hole transport layer, a second light-emitting layer, a second electron transport layer, a second electron injection layer, and a second cathode on the second anodes 42 in the second pixel openings sequentially; wherein, the first light-emitting units 11 and the second light-emitting units 12 constitute a light-emitting functional layer 4.

Specifically, the first light-emitting units 11 may emit red light, green light, or blue light, and the second light-emitting units 12 may also emit red light, green light, or blue light. Additionally, structures and materials of the first light-emitting units 11 and the second light-emitting units 12 may be the same. Of course, light-emitting materials of the first light-emitting layer and the second light-emitting layer may be different, and there is no restriction herein.

Figure 10:
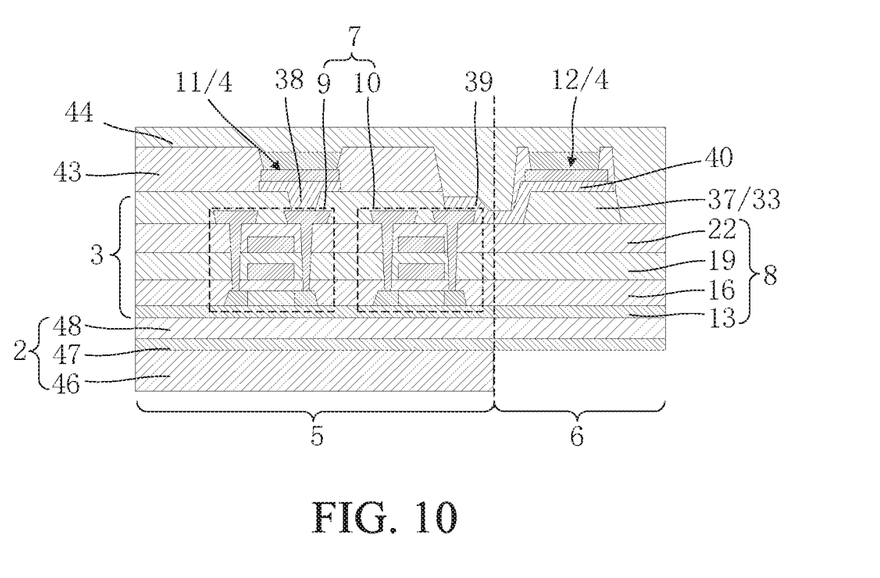
FIG. 10 is a structural schematic view of a display panel manufactured on the basis of FIG. 9.

Specifically, as shown in FIG. 10, the manufacturing method of the display panel 1 further includes following steps:

forming a package layer 44 on the array substrate 3 and the light-emitting function layer 4, wherein the package layer 44 may be a thin film package layer, that is to say, the package layer 44 includes a first inorganic package layer covering the array substrate 3 and the light emitting functional layer 4, an organic package layer disposed on the first inorganic package layer, and a second inorganic package layer disposed on the first inorganic package layer- and the organic package layer;

removing the glass substrate 45 by laser lift-off technology; and removing the first organic layer 46 disposed in the sensor light-receiving area 6 by laser cauterization.

Specifically, in a formed display panel 1, the first organic layer 46 is disposed in the display area 5, and the second organic layer 48 is disposed in the display area 5 and the sensor light-receiving area 6.

In the embodiment, the display panel 1 includes a display area 5 and a sensor light-receiving area 6, both of the display area 5 and the sensor light-receiving area 6 are provided with the light-emitting functional layer 4 for light-emitting display, and the thin film transistor array 7 for controlling the light-emitting display of the light-emitting functional layer 4 in the array substrate 3 is disposed in the display area 5, which prevents disposing metal layers and semiconductor layers with shielding effect in the sensor light-receiving area 6 and improves a light transmission effect of the sensor light-receiving area 6, thereby making the sensor light-receiving area 6 achieve good light transmission function without drilling a hole, preventing poor display of the display area caused by drilling a hole, which is conducive to realizing under-screen identification technology and improving a yield of the display panel 1. Additionally, the light-emitting functional layer 4 is disposed in the display area 5 and the sensor light-receiving area 6 to achieve full screen display. Therefore, the display panel 1 provided by the present disclosure can realize both the under-screen identification technology and the full screen display without drilling a hole.

In the above embodiments, description of each embodiment has its own emphasis. For parts not detailed in one embodiment can refer to the relevant description of other embodiments.

The display panel, the display device and the manufacturing method of the display panel provided in the embodiments of the present disclosure have been described in detail above. Specific examples are applied to explain principle and implementation mode of the present disclosure in this paper. The description of the above embodiments is merely used to help understand the technical solution and core idea of the application. The ordinary person skilled in the art shall understand that they can still modify the technical solution recorded in the above embodiments, or replace some of the technical features equally. These modifications or substitutions do not make the nature of the corresponding technical solution deviate from the scope of the technical solution of the embodiments of the present disclosure.

What is claimed is:

1. A display panel, comprising an array substrate and a light-emitting function layer disposed on the array substrate, wherein the display panel comprises a display area and a sensor light-receiving area adjacent to the display area; and
wherein the array substrate comprises a thin film transistor array disposed in the display area, the light-emitting function layer is disposed in the display area and the sensor light-receiving area, the thin film transistor array is electrically connected to the light-emitting function layer, and the thin film transistor array comprises first thin film transistors and second thin film transistors,
wherein the display panel further comprises a base substrate, the base substrate comprises a first organic layer, an inorganic layer, and a second organic layer, the inorganic layer, and the second organic layer are sequentially disposed on the first organic layer, and the first thin film transistors, the second thin film transistors, and the light-emitting function layer are disposed on the second organic layer; and
the first organic layer is disposed in the display area but not in the sensor light-receiving area, and a material of the first organic layer comprises yellow polyimide; the second organic layer is disposed in the display area and the sensor light-receiving area, and a material of the second organic layer comprises colorless polyimide, and the inorganic layer is disposed in the display area and the sensor light-receiving area.

2. The display panel in claim 1, the second thin film transistors are disposed closer to the sensor light-receiving area than the first thin film transistors;
wherein the light-emitting function layer comprises first light-emitting units disposed in the display area and second light-emitting units disposed in the sensor light-receiving area; and
wherein the first thin film transistors are electrically connected to the first light-emitting units, and the second thin film transistors are electrically connected to the second light-emitting units.

3. The display panel in claim 2, wherein the display panel further comprises transparent electrodes disposed on the second thin film transistors and electrically connected to the second thin film transistors, the transparent electrodes extend from the display area to the sensor light-receiving area, and the transparent electrodes are electrically connected to the second light-emitting units.

4. The display panel in claim 1, wherein an inorganic insulating layer arranged in multi-layer stack is disposed in the sensor light-receiving area of the array substrate.

5. The display panel in claim 4, wherein the inorganic insulating layer arranged in multi-layer stack comprises a buffer layer, and a first gate insulating layer, a second gate insulating layer, and an interlayer dielectric layer sequentially disposed on the buffer layer.

6. The display panel in claim 5, wherein materials of the buffer layer, the first gate insulating layer, the second gate insulating layer, and the interlayer dielectric layer comprise any one of silicon oxide or silicon nitride.

7. A display device, comprising the display panel as claimed in claim 1 and an optical sensor disposed on a back of the display panel; wherein the optical sensor is disposed correspondingly to the sensor light-receiving area.

8. The display device in claim 7, wherein the optical sensor comprises any one of a camera, a fingerprint recognition sensor, or a facial recognition sensor.

9. The display device in claim 7, wherein the first thin film transistors; wherein the light-emitting function layer comprises first light-emitting units disposed in the display area and second light-emitting units disposed in the sensor light-receiving area; and
wherein the first thin film transistors are electrically connected to the first light-emitting units, and the second thin film transistors are electrically connected to the second light-emitting units.

10. The display device in claim 9, wherein the display panel further comprises transparent electrodes disposed on the second thin film transistors and electrically connected to the second thin film transistors, the transparent electrodes extend from the display area to the sensor light-receiving area, and the transparent electrodes are electrically connected to the second light-emitting units.

11. The display device in claim 7, wherein an inorganic insulating layer arranged in multi-layer stack is disposed in the sensor light-receiving area of the array substrate.

12. The display device in claim 11, wherein the inorganic insulating layer arranged in multi-layer stack comprises a buffer layer, and a first gate insulating layer, a second gate insulating layer, and an interlayer dielectric layer sequentially disposed on the buffer layer.

13. The display device in claim 12, wherein materials of the buffer layer, the first gate insulating layer, the second gate insulating layer, and the interlayer dielectric layer comprise any one of silicon oxide or silicon nitride.

14. The display panel in claim 3, wherein the array substrate further comprises a planarization layer covering the thin film transistor array, in the display area, the planarization layer comprises a first anode connection hole and a second anode connection hole corresponding to the first thin film transistors and the second first thin film transistors, in the sensor light-receiving area, the planarization layer includes an anode connection groove and a planarization layer unit adjacent to the anode connection groove, and the anode connection groove extends to the display area and is connected to the second anode connection hole, at least one of the transparent electrodes comprises a first transparent electrode unit disposed in the first anode connection hole, a second transparent electrode unit disposed in the second anode connection hole and the anode connection groove, and a third transparent electrode unit disposed on the planarization layer unit, and the first transparent electrode unit extends to a surface of the planarization layer, and the second transparent electrode unit is connected to the third transparent electrode unit.

15. The display device in claim 10, wherein the array substrate further comprises a planarization layer covering the thin film transistor array, in the display area, the planarization layer comprises a first anode connection hole and a second anode connection hole corresponding to the first thin film transistors and the second first thin film transistors, in the sensor light-receiving area, the planarization layer includes an anode connection groove and a planarization layer unit adjacent to the anode connection groove, and the anode connection groove extends to the display area and is connected to the second anode connection hole, at least one of the transparent electrodes comprises a first transparent electrode unit disposed in the first anode connection hole, a second transparent electrode unit disposed in the second anode connection hole and the anode connection groove, and a third transparent electrode unit disposed on the planarization layer unit, and the first transparent electrode unit extends to a surface of the planarization layer, and the second transparent electrode unit is connected to the third transparent electrode unit.

* * * * *